(12) United States Patent
Shih et al.

(10) Patent No.: US 7,732,886 B2
(45) Date of Patent: Jun. 8, 2010

(54) PIN PHOTODIODE STRUCTURE

(75) Inventors: Hung-Lin Shih, Hsinchu (TW);
Tsan-Chi Chu, Hsin-Chu (TW);
Wen-Shiang Liao, Miao-Li Hsien (TW); Wen-Ching Tsai, Hsinchu County (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 12/173,807

(22) Filed: Jul. 15, 2008

(65) Prior Publication Data

US 2010/0012974 A1 Jan. 21, 2010

(51) Int. Cl.
*H01L 29/06* (2006.01)

(52) U.S. Cl. .................. 257/458; 257/618; 257/656; 257/E29.336; 257/E31.061; 257/E31.062; 257/E31.087; 257/E31.088; 257/E33.046

(58) Field of Classification Search ............. 257/458, 257/656, E29.336, E31.061, E31.062, E31.087, 257/E31.088, E33.046, 618
See application file for complete search history.

(56) References Cited

U.S. PATENT DOCUMENTS

| 5,432,366 | A | * | 7/1995 | Banerjee et al. ............. 257/327 |
|---|---|---|---|---|
| 6,303,979 | B1 | * | 10/2001 | Kasahara ................. 257/656 |
| 6,335,558 | B1 | * | 1/2002 | Drobny et al. ............ 257/591 |
| 6,429,499 | B1 | * | 8/2002 | Heineke et al. ........... 257/458 |
| 6,437,372 | B1 | * | 8/2002 | Geva et al. ................. 257/94 |
| 6,635,110 | B1 | | 10/2003 | Luan et al. |
| 6,713,796 | B1 | * | 3/2004 | Fox ......................... 257/292 |
| 6,737,718 | B2 | * | 5/2004 | Takeuchi ................. 257/431 |
| 6,991,892 | B2 | | 1/2006 | Block |
| 7,008,813 | B1 | | 3/2006 | Lee et al. |
| 7,397,101 | B1 | * | 7/2008 | Masini et al. ............ 257/458 |
| 7,557,418 | B2 | * | 7/2009 | Nakaji et al. ............ 257/432 |
| 7,560,784 | B2 | * | 7/2009 | Cheng et al. ............. 257/401 |
| 2004/0135235 | A1 | * | 7/2004 | Poveda .................... 257/656 |
| 2006/0091490 | A1 | * | 5/2006 | Chen et al. .............. 257/458 |
| 2009/0115016 | A1 | * | 5/2009 | Iwai ........................ 257/463 |

OTHER PUBLICATIONS

Donghwan Ahn, et al., "High performance, waveguide integrated Ge photodetectors", Apr. 2, 2007, 3916-3921, vol. 15, No. 7, Optics Express.

* cited by examiner

*Primary Examiner*—Ida M Soward
(74) *Attorney, Agent, or Firm*—Winston Hsu (57) ABSTRACT

A PIN photodiode structure includes a substrate, a P-doped region disposed in the substrate, an N-doped region disposed in the substrate, and a first semiconductor material disposed in the substrate and between the P-doped region and the N-doped region.

9 Claims, 8 Drawing Sheets

PIN PHOTODIODE STRUCTURE

BACKGROUND OF THE INVENTION

1. Field of the Invention

The present invention relates to a photodiode structure and the method for making the photodiode. In particular, the present invention relates to a photosensitive PIN photodiode structure and the method for manufacturing the photodiode.

2. Description of the Prior Art

The conventional copper cables are less and less likely capable to carry more and more signals to travel a longer and longer distance due to the physical limitation of electrical resistance and signal delays. Naturally, optical fibers meet the demand of carrying very large information to travel a very long distance so they replace the conventional copper cables to be the medium of long distance carrier of information because one single optical fiber allows multiple beams of light of different wavelength, each carrying different information to travel at the speed of light without mutual interference and without attenuating too much after traveling an extreme long distance.

Light of different wavelengths in the form of pulse signals constitutes the basic principle of transmission by optical fiber. However, such basic principle of transmission is not compatible with the basic principle of transmission by electron current in the current electronic devices to carry and to transmit signals. In order to form a transform medium between the optical fiber transmission and the electron current transmission, the photo-detector is deemed to be a convenient tool.

The photo-detector is an important photo-electrical transform unit. The photo-detector is capable of transforming the optical signals to electrical signals (into voltage or current), so it can transform the optical pulse signals in the optical fibers to become the electrical signals which can be carried, transmitted or used by ordinary electronic devices. Amongst them, the PIN (p-intrinsic-n photodiode) which has the advantages of easy to be manufactured, high reliability, low noise, compatible with low-voltage amplifier circuits and very wide bandwidth becomes one of the most widely used photo-detector.

The basic operational mechanism of the PIN photodiode is that when the incident light hits the p-n junction of the semiconductor, the electrons in the valence band of the semiconductor would absorb the energy of the photons in the incident light and jump over the forbidden band to arrive at the conduction band, which means, the incident photons create electrons, called photo-electrons, in the conduction band of the semiconductor if the photons have sufficient energy. Simultaneously, an electrical hole is left behind in the valence band and an electron-hole pair, or called photocarrier, is thus generated, which is also known as the photoelectric effect of the semiconductors. Afterwards, the photo-electron and the corresponding hole are quickly separated under the influence of an inner electric field and an outer negative bias to be respectively collected at the positive electrode and the negative electrode. Therefore, a photo-current appears in the outer circuit.

In order to enhance the operational performance of the PIN photodiode, the current technology integrates the Ge semiconductor material into the Si substrate to accomplish an optical communication of wide wavelength because Ge is deemed to have much higher carrier mobility than Si. The importance of integration of Ge semiconductor material into the Si substrate lies in the essential qualities of fast, effective and low noise. The photo-detectors made of Ge have the capabilities of effectively detecting the optical signals at the wavelength used by the optical communication. In addition, if the photo-detectors made of Ge are integrated with the conventional processes of Si type, it would be able to further lower the cost of the PIN photodiode.

Figure 1:
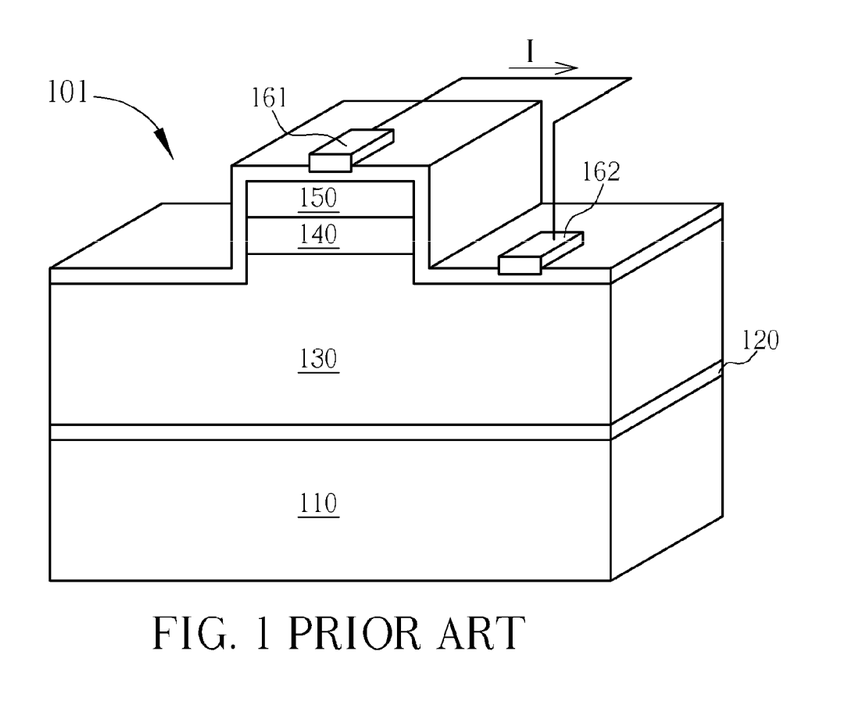
FIG. 1 illustrates the conventional PIN photodiode with Ge semiconductor material.

There is a known PIN photodiode which integrates the Ge semiconductor material into the Si substrate. FIG. 1 illustrates the conventional PIN photodiode with Ge semiconductor material. The PIN photodiode 101 includes a Si substrate 110, an oxide layer 120, a P-doped Si 130, the intrinsic Ge 140, an N-doped Si 150, electrode regions such as the first electrode region 161 and the second electrode region 162. The P-doped Si 130, the intrinsic Ge 140 and the N-doped Si 150 together constitute the core element of the PIN photodiode. Because in the above-mentioned structure of the PIN photodiode 101, the first electrode region 161 in the electrode regions is disposed above the N-doped Si 150, such arrangement will decrease the frontal area to receive light and the quantum yield is thus lower due to the incident light partially absorbed by passing through the p-doped Si 130. Moreover, the manufacturing process of the PIN photodiode 101 is not fully compatible with that of the conventional MOS. Accordingly, it is needed to provide a novel PIN photodiode structure and the method for making the PIN photodiode to more effectively integrate the manufacturing process of the novel PIN photodiode structure with the traditionally fully-developed MOS manufacturing process to lower the manufacturing cost.

SUMMARY OF THE INVENTION

Accordingly, the present invention provides a novel PIN photodiode structure and the method for making the PIN photodiode to more effectively integrate the manufacturing process with the traditionally fully-developed MOS manufacturing process in order to lower the manufacturing cost and to solve the above-mentioned problems.

The present invention first relates to a PIN photodiode structure. The PIN photodiode structure of the present invention includes a semiconductor substrate including Si, a P-doped region disposed in the substrate, an N-doped region disposed in the substrate and, a first semiconductor material disposed in the semiconductor substrate and between the P-doped region and the N-doped region. Preferably, the first semiconductor material includes Ge or has a Ge concentration gradient.

The present invention secondly relates to a method for forming a PIN photodiode structure. In the method for forming a PIN photodiode structure of the present invention first a semiconductor substrate including a P-doped region and an N-doped region is provided. Second, a trench disposed in the semiconductor substrate and between the P-doped region and the N-doped region is formed. Then the trench is filled with a first semiconductor material, so that the first semiconductor material may be bulging from the trench. Preferably, the first semiconductor material includes Ge or has a Ge concentration gradient.

Because the P-doped region and the N-doped region for use as the conductive electrodes in the PIN photodiode structure of the present invention all are disposed in the substrate of the semiconductor, the PIN photodiode structure has larger area for receiving the incident light. Further, the manufacturing process of the PIN photodiode structure of the present invention can be more effectively integrated with the traditionally fully-developed MOS manufacturing process to lower the manufacturing cost.

These and other objectives of the present invention will no doubt become obvious to those of ordinary skill in the art after

DETAILED DESCRIPTION

The present invention provides a novel PIN photodiode structure and the method for making the PIN photodiode. Because each of the P-doped region and the N-doped region for use as the conductive electrodes in the PIN photodiode structure of the present invention is disposed in the substrate of the semiconductor adjacent to the Ge semiconductor material, not only does the PIN photodiode structure have much larger area for receiving the incident light, but also the manufacturing process of the PIN photodiode structure of the present invention can be more effectively integrated with the traditionally fully-developed MOS manufacturing process to lower the manufacturing cost and to solve the above-mentioned problems.

Figure 2:
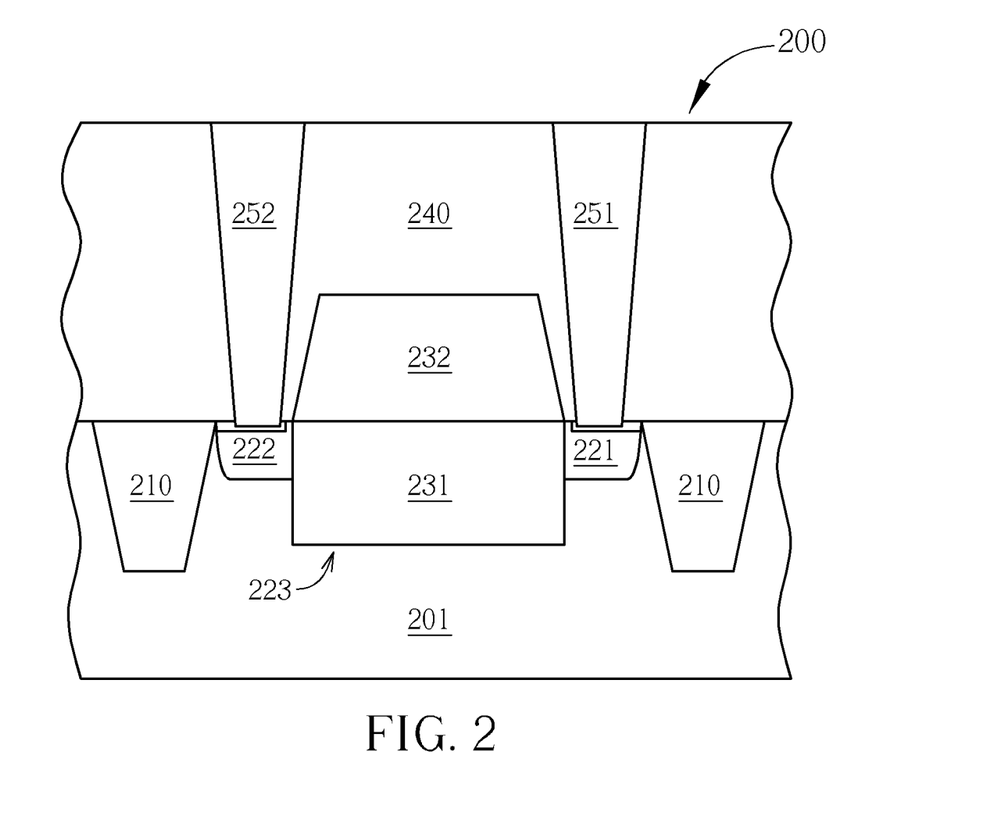
FIG. 2 illustrates a preferred embodiment of the photodiode structure of the present invention.

The present invention first provides a photodiode structure. FIG. 2 illustrates a preferred embodiment of the photodiode structure of the present invention. The photodiode structure 200 of the present invention includes a semiconductor substrate 201, a shallow trench isolation (STI) 210, a P-type doped region 221, an N-type doped region 222, a trench 223, an interlayer dielectric 240, a P-type doped region plug 251 and an N-type doped region plug 252.

The semiconductor substrate 201 may be a common semiconductor substrate, such as Si or SOI. The isolation structure such as the shallow trench isolation (STI) 210 is disposed on the semiconductor substrate 201 to segregate different element regions. As shown in FIG. 2, the photodiode structure 200 of the present invention has the shallow trench isolation (STI) 210.

The trench 223 is located in the semiconductor substrate 201 surrounded by the shallow trench isolation (STI) 210. In addition, the P-type doped region 221 and the N-type doped region 222 in the semiconductor substrate 201 are just disposed on the two opposite sides of the trench 223. The P-type doped region 221 and the N-type doped region 222 may be formed in the semiconductor substrate 201 by using the conventional ion implantation in accordance with convention dopants. In addition, the P-type doped region 221 and the N-type doped region 222 can be activated by a thermal diffusion step or an annealing step.

The first semiconductor material 231 is disposed in the trench 223 and fills the trench 223. Because the trench 223 is located in the semiconductor substrate 201 and between the P-type doped region 221 and the N-type doped region 222, the first semiconductor material 231 is disposed in the semiconductor substrate 201 and between the P-type doped region 221 and the N-type doped region 222, too. The first semiconductor material 231 may be a common semiconductor substrate, such as Si, Ge or the combination thereof. Preferably, the first semiconductor material 231 has a Ge concentration gradient.

Furthermore, on the first semiconductor material 231 there may be another second semiconductor material 232 which is connected to the first semiconductor material 231 and protrudes from the surface of the first semiconductor material 231. The second semiconductor material 232 may be a common semiconductor substrate, such as Si, Ge or the combination thereof. Preferably, the second semiconductor material 232 may have a Ge concentration gradient inherited from the Ge concentration gradient of the first semiconductor material 231.

The interlayer dielectric 240 covers the semiconductor substrate 201, the P-type doped region 221, the N-type doped region 222, the trench 223, a shallow trench isolation (STI) 210, the P-type doped region 221, the N-type doped region 222, the first semiconductor material 231 and the second semiconductor material 232. Further, within the interlayer dielectric 240 there is a P-type doped region plug 251 disposed on the P-type doped region 221 to construct the electrical connection between the P-type doped region 221 and the following other overlying layers. Similarly, the N-type doped region plug 252 is disposed within the interlayer dielectric 240 and on the N-type doped region 222 to construct the electrical connection between the N-type doped region 222 and the following other overlying layers. The P-type doped region plug 251 and the N-type doped region plug 252 may respectively include conventional conductive materials, such as Al or W. Optionally, on the surface of the P-type doped region 221 and the N-type doped region 222 there may be an additional silicide such as cobalt silicide or nickel silicide to decrease the surface resistance of the P-type doped region plug 251 to the P-type doped region 221 and of the N-type doped region plug 252 to the N-type doped region 222.

Figure 3:
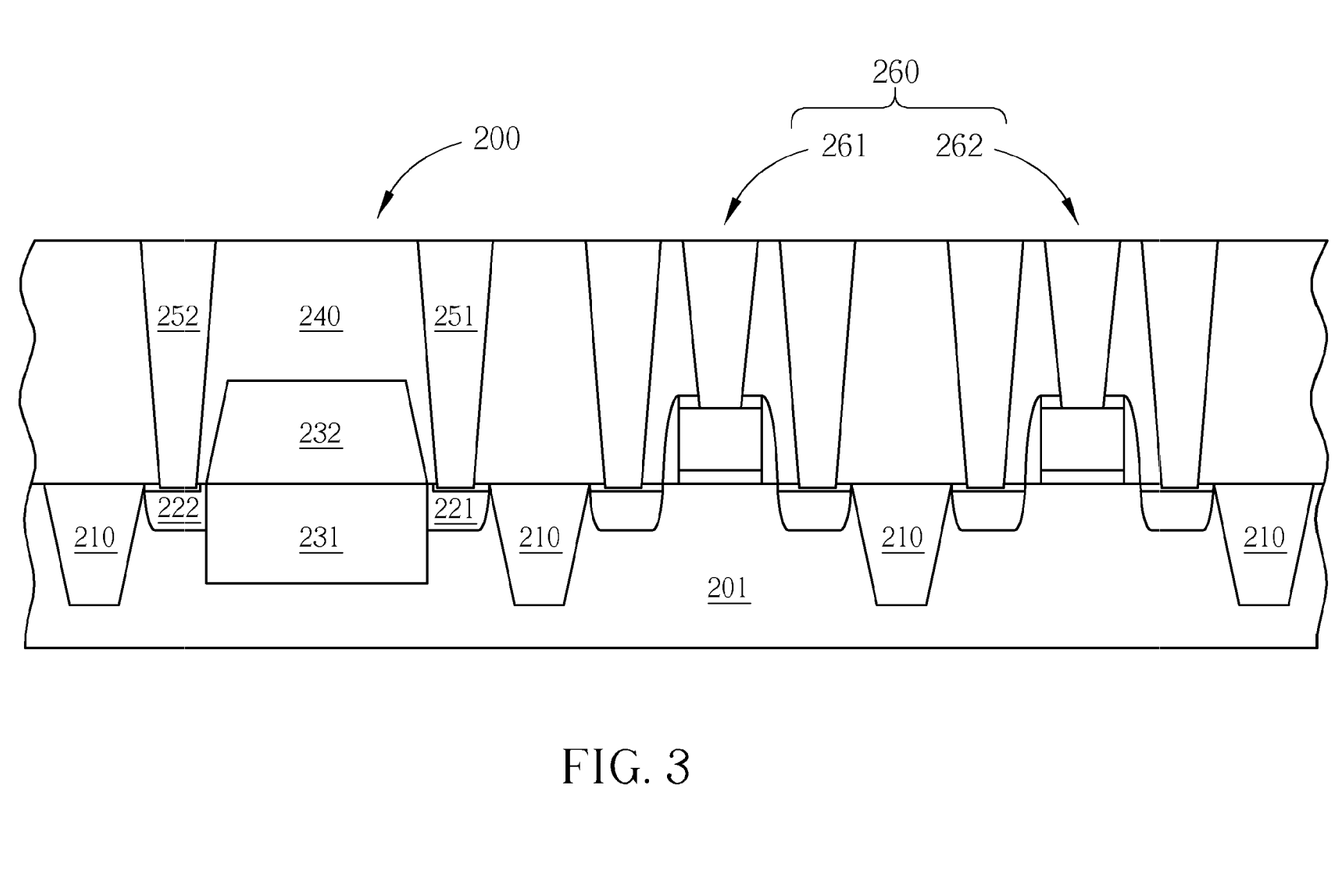
FIG. 3 illustrates a preferred embodiment of CMOS adjacent to the photodiode structure of the present invention.

If necessary, the semiconductor substrate 201 of the present invention may further include at least one MOS. In other words, there may be a CMOS 260 adjacent to the photodiode structure 200. FIG. 3 illustrates a preferred embodiment of CMOS adjacent to the photodiode structure of the present invention. As shown in FIG. 3, the complimentary PMOS 261 and NMOS 262 are disposed adjacent to the photodiode structure 200 of the present invention, segregated by the insulating shallow trench isolation (STI) 210.

Additionally, in order to be fully compatible with the manufacturing process of conventional MOS, the elements in the photodiode structure 200 of the present invention and the elements in the CMOS 260 may share some of the process features. For example, the doping concentration of the P-doped region 221 and of the N-doped region 222 in the photodiode structure 200 of the present invention is substantially the same as at least one of the doped regions of the CMOS 260 such as source or the drain.

Figure 4:
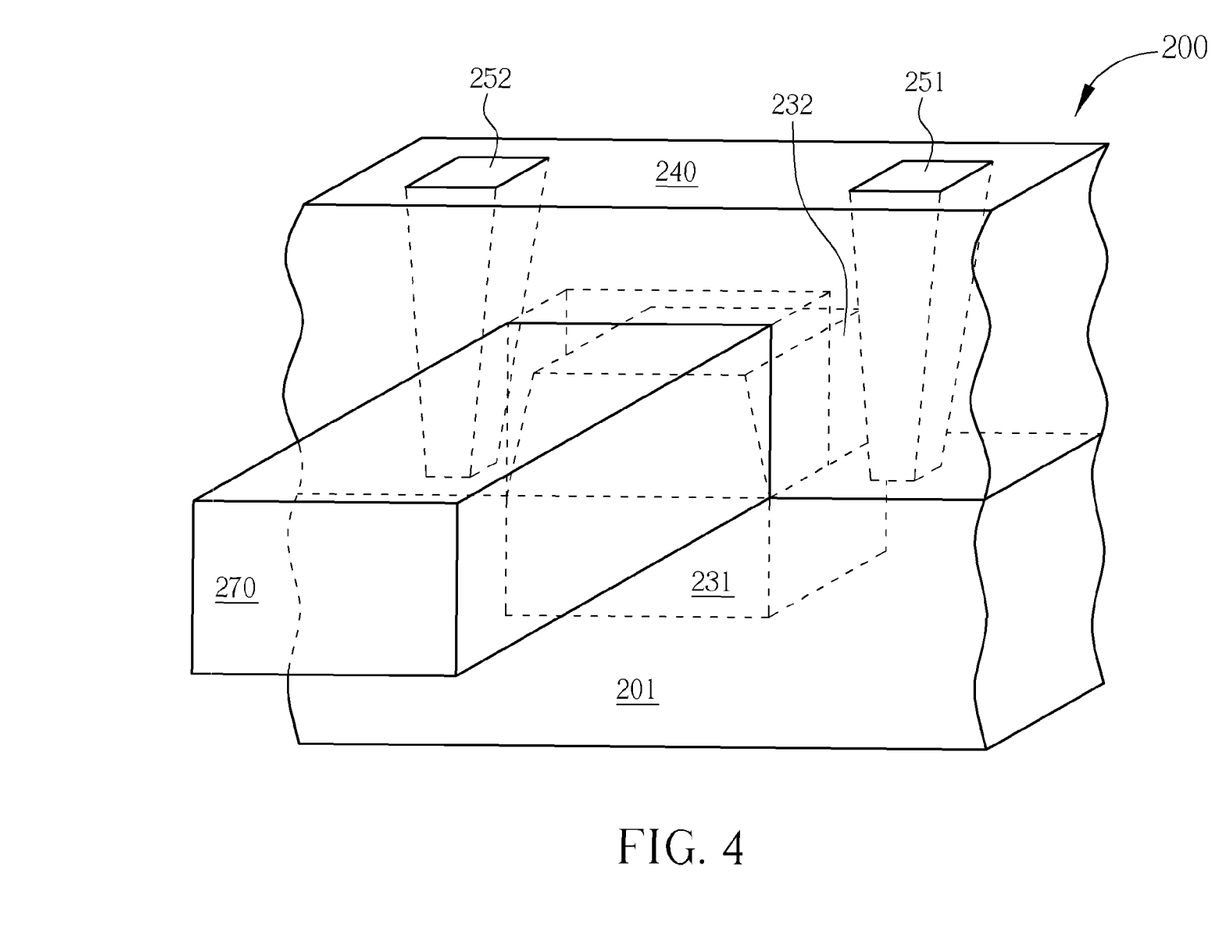
FIG. 4 illustrates a preferred embodiment of the photodiode structure of the present invention receiving the side incident light.

Please notice that the photodiode structure 200 of the present invention may receive light from different directions. For example, as illustrated in FIG. 2, the photodiode structure 200 of the present invention may receive the top incident light. On the other hand, the photodiode structure 200 of the present invention may receive the side incident light. FIG. 4 illustrates a preferred embodiment of the photodiode structure of the present invention receiving the side incident light. The photodiode structure 200 of the present invention additionally include a waveguide 270 for receiving the side incident light so that the photodiode structure 200 of the present invention may receive the top incident light, the side incident light or both.

Figure 5:
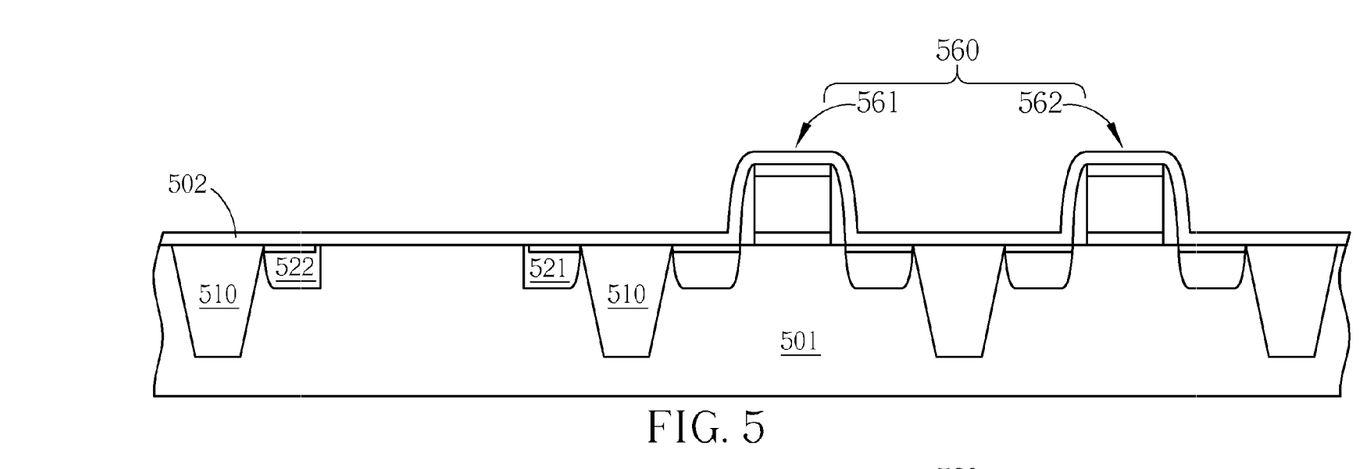
FIGS. 5-9 illustrate a preferred embodiment of the method for forming the PIN photodiode structure of the present invention.

The present invention again provides a method for forming a PIN photodiode structure. FIGS. 5-9 illustrate a preferred embodiment of the method for forming the PIN photodiode structure of the present invention. First, as shown in FIG. 5, a semiconductor substrate 501 is provided. The semiconductor substrate 501 includes a P-doped region 521 and an N-doped region 522. The semiconductor substrate 501 may be a common semiconductor substrate, such as Si. There is an oxide layer 502 covering the surface of the semiconductor substrate 501. The semiconductor substrate 501 may further include at least one MOS. For example, there is a complementary MOS 560 disposed on the semiconductor substrate 501. The complementary MOS 560 includes a complimentary PMOS 561 and NMOS 562, segregated by the insulating shallow trench isolation (STI) 510.

In order to be fully compatible with the manufacturing process of conventional MOS, the elements in the photodiode structure of the present invention and the elements in the CMOS 560 may share some of the process features. For example, the P-type doped region 521 and the N-type doped region 522 in the photodiode structure of the present invention may be formed simultaneously with the formation of the CMOS 560 in the semiconductor substrate 501 by using the conventional ion implantation in accordance with convention dopants. In addition, the P-type doped region 521 and the N-type doped region 522 can be activated by a thermal diffusion step or an annealing step. When the P-type doped region 521 and the N-type doped region 522 are formed simultaneously with the CMOS 560, the doping concentration of at least one of the P-doped region 521 and of the N-doped region 522 in the photodiode structure of the present invention is substantially the same as the doped regions of the CMOS 560 such as source or the drain.

Figure 6:
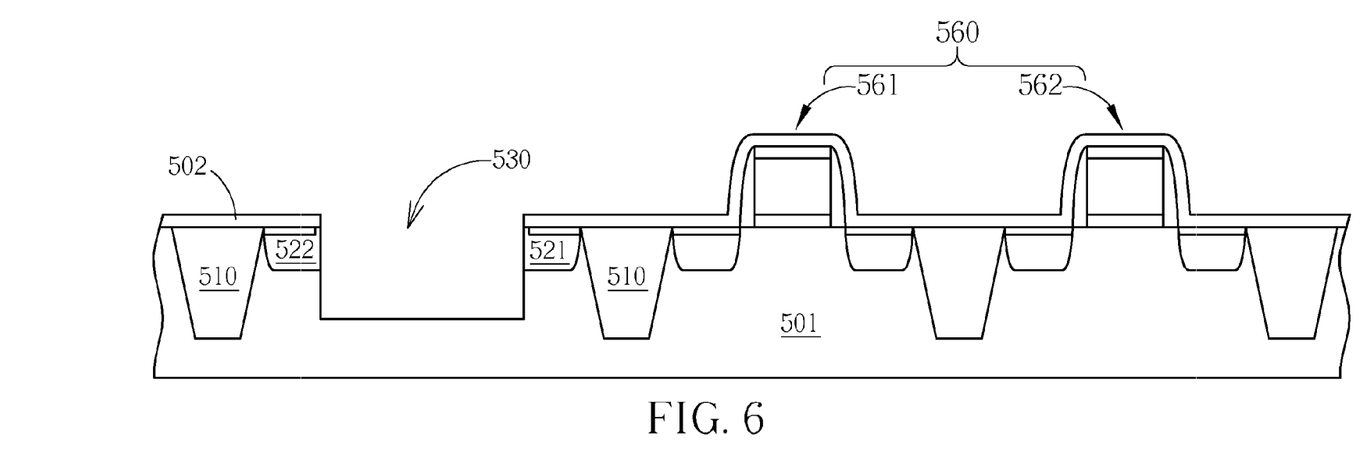

Secondly, as shown in FIG. 6, the trench 530 is formed in the semiconductor substrate 501 and between the P-doped region 521 and the N-doped region 522. For example, the location of the trench 530 is first defined by a convention photoresist, then some of the semiconductor substrate 501 is removed by etching to form the trench 530.

Figure 7:
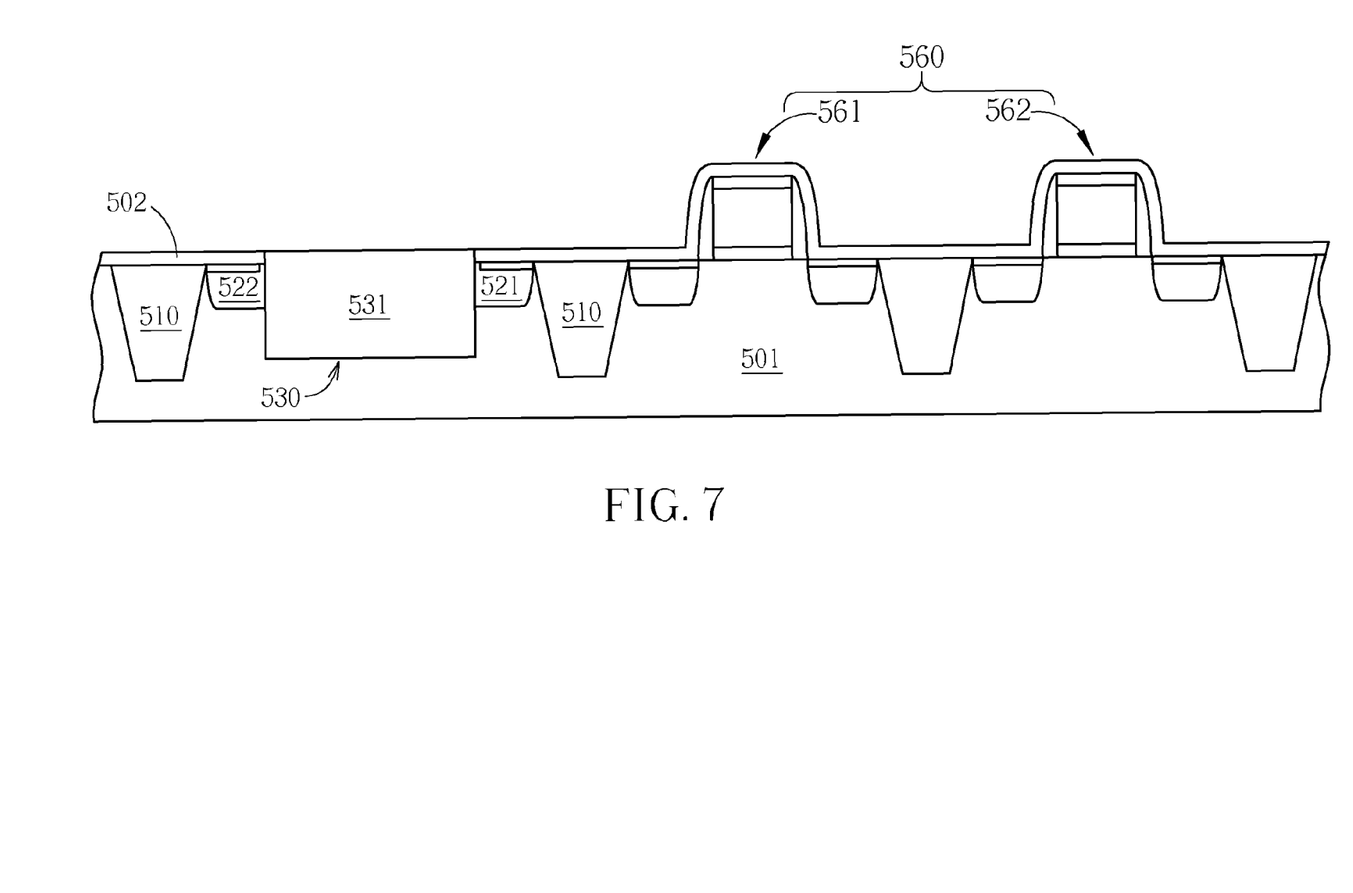

Later, as shown in FIG. 7, the trench 530 is filled with a first semiconductor material 531. The first semiconductor material 531 may be a common semiconductor substrate, such as Si, Ge or the combination thereof. For example, the trench 530 is filled with the first semiconductor material 531 by a conventional epitaxial procedure. Preferably, the first semiconductor material 531 is a mixture of Si and Ge and has a Ge concentration gradient. In such way, the mismatch problem with the lattice of the silicon-containing semiconductor substrate 501 can be effectively avoided.

In one preferred embodiment of the present invention, another second semiconductor material 532 is formed by an extended epitaxial growth procedure on the first semiconductor material 531 and protruding from the surface of the first semiconductor material 531 during the epitaxial growth procedure of the first semiconductor material 531 to receive the top incident light or the side incident light. The second semiconductor material 532 may be a common semiconductor substrate, such as Si, Ge or the combination thereof. Preferably, the second semiconductor material 532 may have a Ge concentration gradient inherited from the Ge concentration gradient of the first semiconductor material 531.

Figure 8:
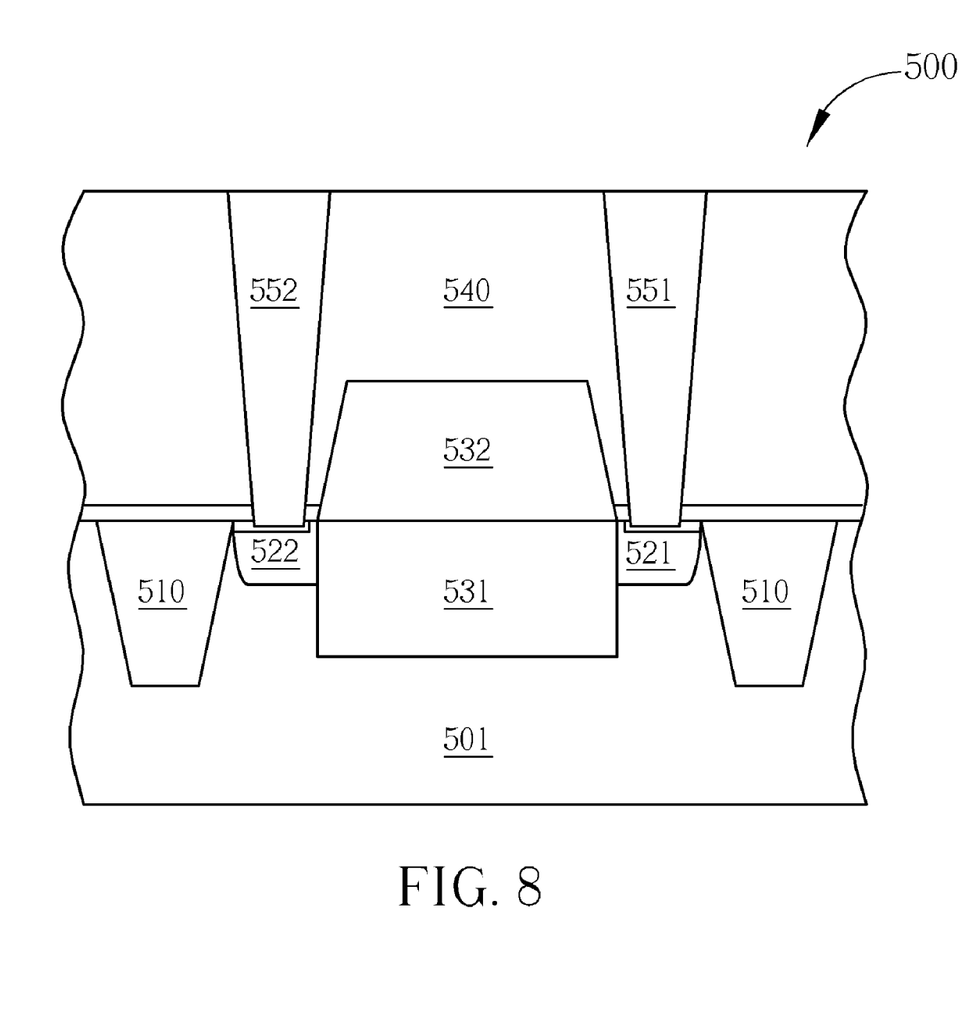

After the process is finished as shown in FIG. 7, then as shown in FIG. 8, an interlayer dielectric 540 is formed to cover the semiconductor substrate 501, the P-type doped region 521, the N-type doped region 522, the first semiconductor material 531 and the second semiconductor material 532. Besides, in order to form the electrical contact, contact holes are formed to accommodate the P-type doped region plug 551 and the N-type doped region plug 552. Optionally, on the surface of the P-type doped region 521 and the N-type doped region 522 a silicide, such as cobalt silicide or nickel silicide, may be formed in advance to decrease the surface resistance of the P-type doped region plug 551 to the P-type doped region 521 and of the N-type doped region plug 552 to the N-type doped region 522.

Figure 9:
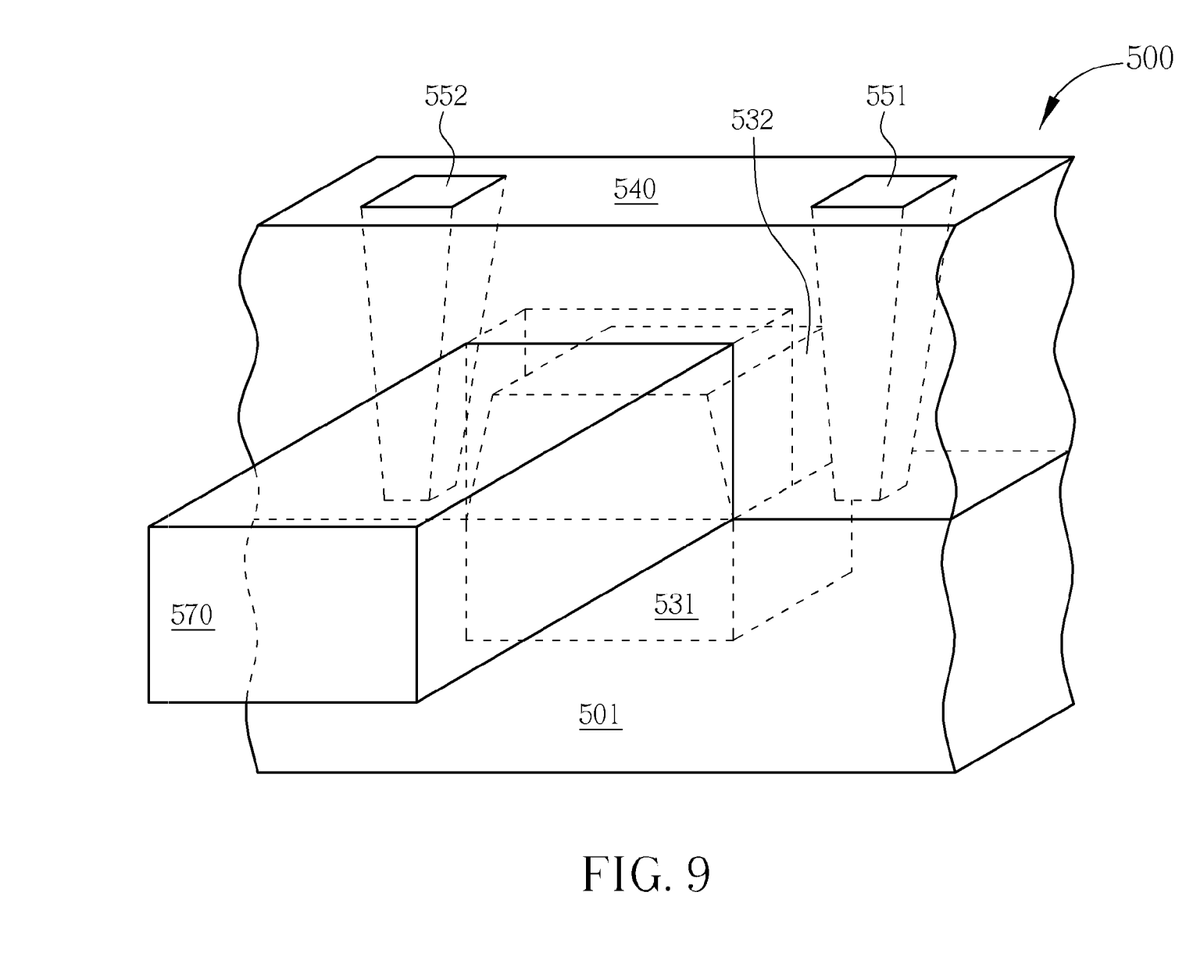

As described above, the photodiode structure fabricated by the method of the present invention may receive light from different directions. For example, as illustrated in FIG. 8, the photodiode structure of the present invention may be useful in receiving the top incident light. On the other hand, the photodiode structure of the present invention may be also useful in receiving the side incident light. FIG. 9 illustrates a preferred embodiment of the photodiode structure fabricated by the method of the present invention for receiving the side incident light. In the photodiode structure of the present invention, a waveguide 270 is additionally formed near the first semiconductor material 531 and by the second semiconductor material 532 for guiding and receiving the side incident light so that the photodiode structure fabricated by the method of the present invention may receive the top incident light, the side incident light or both.

Those skilled in the art will readily observe that numerous modifications and alterations of the device and method may be made while retaining the teachings of the invention.

What is claimed is:

1. A PIN photodiode structure, comprising:
    a semiconductor substrate comprising Si;
    a P-doped region disposed in said substrate;
    an N-doped region disposed in said substrate;
    a first semiconductor material disposed in said semiconductor substrate and between said P-doped region and said N-doped region; and
    a second semiconductor material connected to and bulging from said first semiconductor material, wherein said second semiconductor material comprises Ge.

2. The PIN photodiode structure of claim 1, wherein said first semiconductor material comprises Si and Ge.

3. The PIN photodiode structure of claim 1, wherein said first semiconductor material has a Ge concentration gradient.

4. The PIN photodiode structure of claim 1, further comprising:
    an interlayer dielectric layer covering said semiconductor substrate, said P-doped region, said N-doped region and said first semiconductor material;
    a P-doped region plug disposed in said interlayer dielectric layer on said P-doped region and electrically connected to said P-doped region; and
    an N-doped region plug disposed in said interlayer dielectric layer on said N-doped region and electrically connected to said N-doped region.

5. The PIN photodiode structure of claim 4, further comprising two silicides respectively disposed between said P-doped region plug and said P-doped region, and said N-doped region plug and said N-doped region.

6. The PIN photodiode structure of claim 1, wherein said semiconductor substrate comprises at least a metal-oxide semiconductor (MOS).

7. The PIN photodiode structure of claim 6, wherein the doping concentration of said P-doped region and of said N-doped region is substantially the same as at least one of the source and the drain of said MOS.

8. The PIN photodiode structure of claim 1, for receiving a top incident light.

9. The PIN photodiode structure of claim 8, further comprising a waveguide for receiving a side incident light.

* * * * *